United States Patent
Abdo

(10) Patent No.: US 11,403,168 B2
(45) Date of Patent: Aug. 2, 2022

(54) USING SUPERCONDUCTING MICROWAVE GYRATOR FOR PARITY DETECTION OF WEAK MAGNETIC SOURCES

(71) Applicant: INTERNATIONAL BUSINESS MACHINES CORPORATION, Armonk, NY (US)

(72) Inventor: Baleegh Abdo, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 16/805,212

(22) Filed: Feb. 28, 2020

(65) Prior Publication Data

US 2021/0271545 A1  Sep. 2, 2021

(51) Int. Cl.
G06F 11/10 (2006.01)
G06N 10/00 (2022.01)
H01L 39/24 (2006.01)

(52) U.S. Cl.
CPC ......... G06F 11/1008 (2013.01); G06N 10/00 (2019.01); H01L 39/2493 (2013.01)

(58) Field of Classification Search
CPC .... G06F 11/1008; G06N 10/00; G06N 10/40; G06N 10/70; H01L 39/2493
See application file for complete search history.

(56) References Cited

U.S. PATENT DOCUMENTS

| 7,307,275 | B2 | 12/2007 | Lidar et al. |
| 10,262,276 | B2 | 4/2019 | Puri et al. |
| 10,333,046 | B2 | 6/2019 | Abdo |
| 10,461,385 | B2 | 10/2019 | Sliwa et al. |
| 2018/0017603 | A1 | 1/2018 | Goto |
| 2019/0020346 | A1 | 1/2019 | Wang et al. |
| 2019/0324846 | A1 | 10/2019 | Ioffe et al. |

FOREIGN PATENT DOCUMENTS

EP  3383793 A4  7/2019

OTHER PUBLICATIONS

N. Bergeal et al., Nature 465, 64 (2010).

(Continued)

*Primary Examiner* — Matthew L Reames
(74) *Attorney, Agent, or Firm* — Henry J. Daley; Venable LLP

(57) ABSTRACT

A method of detecting parity of weak magnetic fields includes inputting a first electromagnetic pump drive to a first three-wave mixing Josephson device via a first 90 deg. hybrid; inputting a second electromagnetic pump drive to a second three-wave mixing Josephson device through the first 90 deg. hybrid; and inputting a first electromagnetic wave via a second 90 deg. hybrid connected to the first three-wave mixing Josephson device to output a second electromagnetic wave through the second three-wave mixing Josephson device. The method includes transmitting a third electromagnetic wave via the second 90 deg. hybrid to a third 90 deg. hybrid; and detecting a parity of a first magnet field applied by a first magnetic source and a second magnetic field applied by a second magnetic source based on constructive wave interference or destructive wave interference of the second electromagnetic wave and the third electromagnetic wave.

20 Claims, 10 Drawing Sheets

(56) References Cited

OTHER PUBLICATIONS

B. Abdo et al., APL 99, 162506 (2011).
B. Abdo et al., PRB 87, 014508 (2013).
A. Narla et al., APL 104, 232605 (2014).
M. Roch et al., PRL 108, 147701 (2012).
N. Bergeal et al., Nat. Phys. 6, 296 (2010).
T. Roy et al., Phys. Rev. Applied 7, 054025 (2017).
F. Schackert et al., PRL 111, 073903 (2013).
B. Abdo et al., PRL 110, 173902 (2013).
K. Sliwa et al., PRX 5, 041020 (2015).

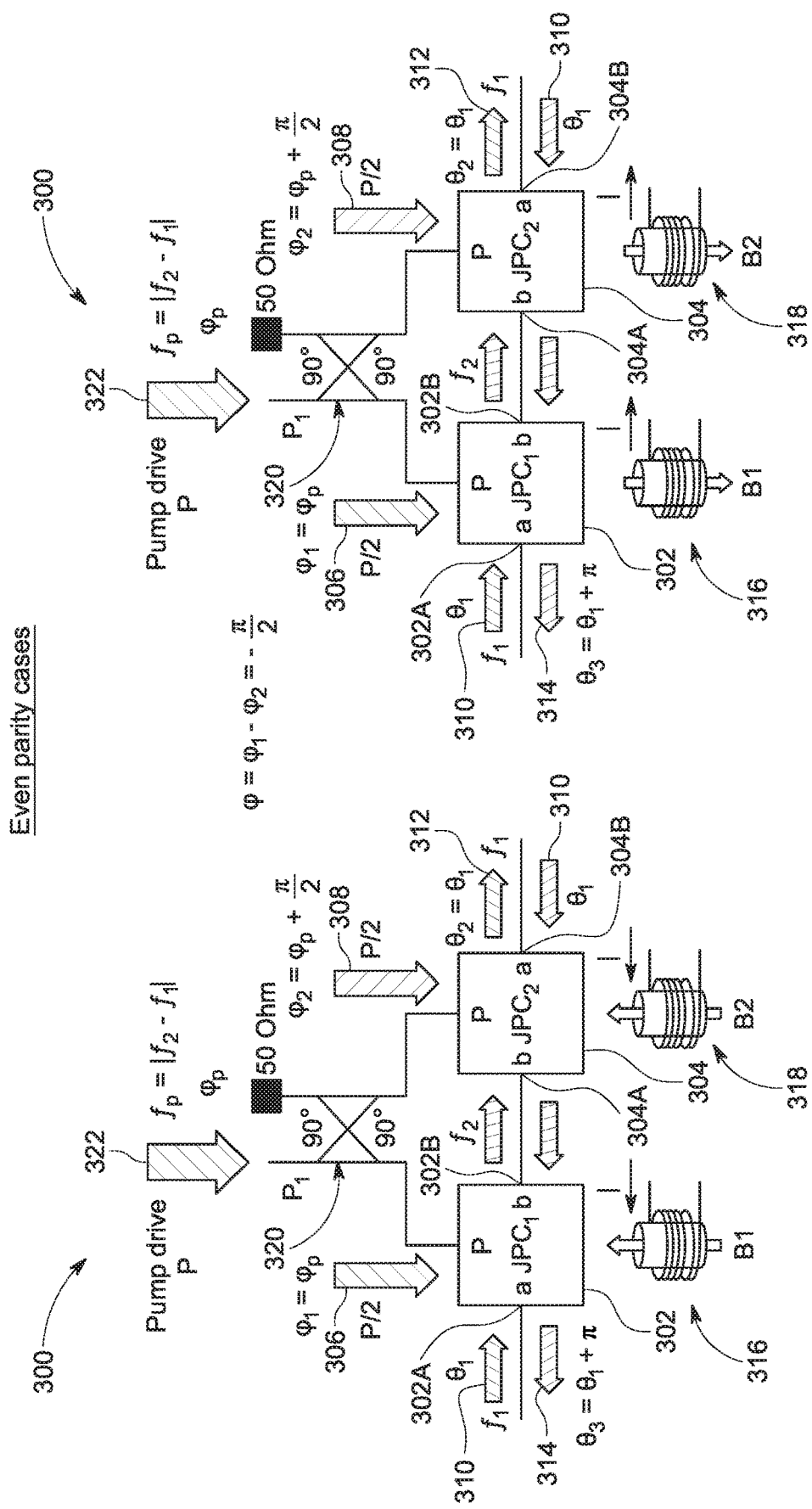

USING SUPERCONDUCTING MICROWAVE GYRATOR FOR PARITY DETECTION OF WEAK MAGNETIC SOURCES

BACKGROUND

The currently claimed embodiments of the present invention relate to superconducting quantum mechanical devices, and more specifically to methods and devices of detecting parity of weak magnetic fields.

The ability to perform quantum parity measurements on qubits can provide a useful means to develop quantum error correction codes, for example. For example, quantum parity measurements enable detecting errors that may occur in a group of qubits without having to acquire information of the quantum state encoded in the qubits. One common method for performing quantum parity measurements on a group of data qubits is to use an ancilla qubit. The ancilla qubit is usually initialized in the ground state and then single qubit gates such as a Hadamard or idle gates are applied to the ancilla qubit followed by two qubit gates such as CNOT gates applied to the ancilla qubit and the data qubits. Finally, single qubit gates are applied to the ancilla qubit, followed by a measurement of the state of the ancilla qubit. The measurement result (i.e., eigenvalue) of the ancilla qubit indicates whether the group of qubits which have been entangled via the gates have an odd or even parity. However, this method of measuring parity to detect errors in the case of a surface error correction code, requires a large amount of ancilla qubits, a large amount of coupling components (because each data qubit is coupled to four ancilla qubits and vice versa). In addition, the entangling gates (CNOT gates) can themselves introduce errors and add a considerable time overhead to any algorithm running on a quantum processor.

SUMMARY

An aspect of the present invention is to provide a method of detecting parity of weak magnetic fields. The method includes inputting a first electromagnetic pump drive having a first pump phase to a first three-wave mixing Josephson device; and inputting a second electromagnetic pump drive having a second pump phase to a second three-wave mixing Josephson device, the first pump phase and the second pump phase being shifted relative to each other by approximately 90 deg. (pi/2), and an input of the second three-wave mixing Josephson device being coupled to an output of the first three-wave mixing Josephson device. The method also includes inputting a first electromagnetic wave to the first three-wave mixing Josephson device to output a second electromagnetic wave after passing through the second three-wave mixing Josephson device, or inputting the first electromagnetic wave to the second three wave mixing Josephson device to output a third electromagnetic wave after passing through the first three-wave mixing Josephson device. The method further includes detecting a parity of an orientation of a first magnetic field applied by a first magnetic source to the first three-wave mixing device and a second magnetic field applied by a second magnetic source to the second three-wave mixing device based on a first phase of the first electromagnetic wave, a second phase of the second electromagnetic wave, a third phase of the third electromagnetic wave, a first pump phase of the first electromagnetic pump drive and a second pump phase of the second electromagnetic pump drive.

In an embodiment, detecting the parity includes detecting an even parity when the second pump phase is substantially equal to the first pump phase plus 90 deg., the first phase of the first electromagnetic wave is substantially equal to the second phase of the second electromagnetic wave modulo 360 deg., and the third phase of the third electromagnetic wave is substantially equal to the first phase plus 180 deg. modulo 360 deg.

In an embodiment, detecting the parity includes detecting an even parity when the first pump phase is substantially equal to the second pump phase plus 90 deg., the second phase of the second electromagnetic wave is substantially equal to the first phase of the first electromagnetic wave plus 180 deg. modulo 360 deg., and the third phase of the third electromagnetic wave is substantially equal to the first phase modulo 360 deg.

In an embodiment, detecting the parity includes detecting an odd parity when the second pump phase is substantially equal to the first pump phase plus 90 deg., the second phase of the second electromagnetic wave is substantially equal to the first phase of the first electromagnetic wave plus 180 deg. modulo 360 deg., and when the third phase of the third electromagnetic wave is substantially equal to the first phase modulo 360 deg.

In an embodiment, detecting the parity includes detecting an odd parity when the first pump phase is substantially equal to the second pump phase plus 90 deg., the second phase of the second electromagnetic wave is substantially equal to the first phase modulo 360 deg. of the first electromagnetic wave, and when the third phase of the third electromagnetic wave is substantially equal to the first phase plus 180 deg. modulo 360 deg.

In an embodiment, inputting the first electromagnetic pump drive having the first pump phase to the first three-wave mixing Josephson device includes inputting the first electromagnetic pump drive to a first three-wave mixing Josephson device via a first 90 deg. hybrid. In an embodiment, inputting the second electromagnetic pump drive having the second pump phase to the second three-wave mixing Josephson device includes inputting the second electromagnetic pump drive to the second three-wave mixing Josephson device through the first 90 deg. hybrid.

In an embodiment, detecting the parity of the first magnet field and the second magnetic field includes detecting an even parity when the first and the second magnetic fields are oriented substantially in a same direction. In an embodiment, detecting the parity of the first magnet field and the second magnetic field includes detecting an odd parity when the first and the second magnetic fields are oriented substantially in opposite directions.

Another aspect of the present invention is to provide a method of detecting parity of weak magnetic fields. The method includes inputting a first electromagnetic pump drive to a first three-wave mixing Josephson device via a first 90 deg. hybrid; inputting a second electromagnetic pump drive to a second three-wave mixing Josephson device through the first 90 deg. hybrid, an input of the second three-wave mixing Josephson device being coupled to an output of the first three-wave mixing Josephson device; and inputting a first electromagnetic wave via a second 90 deg. hybrid connected to the first three-wave mixing Josephson device to output a second electromagnetic wave through the second three-wave mixing Josephson device. The method further includes transmitting a third electromagnetic wave via the second 90 deg. hybrid to a third 90 deg. hybrid connected to the second three-wave mixing Josephson device; and detecting a parity of a first magnet field applied by a first magnetic source to the first three-wave mixing device and a second magnetic field applied by a second magnetic source to the second three-wave mixing device based on constructive wave interference or destructive wave interference of the second electromagnetic wave and the third electromagnetic wave after passing through the third 90 deg. hybrid at the output of the third 90 deg. hybrid.

In an embodiment, inputting the first electromagnetic pump drive includes inputting the first electromagnetic pump drive having a first pump phase and inputting a second electromagnetic pump drive having a second pump phase shifted relative to the first pump phase by 90 deg. (pi/2).

In an embodiment, inputting the first electromagnetic wave via the second 90 deg. hybrid to output the second electromagnetic wave includes inputting the first electromagnetic wave having a first phase to output the second electromagnetic wave having a second phase that is substantially equal to the first phase or substantially equal to the first phase plus 180 deg. (pi).

In an embodiment, transmitting the third electromagnetic wave via the second 90 deg. hybrid to the third 90 deg. hybrid includes transmitting the third electromagnetic wave having a third phase that is substantially equal to a first phase of the first electromagnetic wave plus 90 deg. In an embodiment, transmitting the third electromagnetic wave via the second 90 deg. hybrid to the third 90 deg. hybrid further includes adding a 90 deg. phase shift to the third phase of the third electromagnetic wave to obtain a third electromagnetic wave having a third phase that is substantially equal to the first phase plus 180 deg.

In an embodiment, detecting the parity of the first magnet field and the second magnetic field based on constructive wave interference or destructive wave interference at the output of the third 90 deg. hybrid includes detecting a constructive interference of the second electromagnetic wave and the third electromagnetic wave when a third phase of the third electromagnetic wave at the output of the third 90 deg. hybrid substantially matches a second phase of the second electromagnetic wave output at the third 90 deg. hybrid.

In an embodiment, detecting the parity of the first magnet field and the second magnetic field based on constructive wave interference or destructive wave interference at the output of the third 90 deg. hybrid includes detecting a destructive interference of the second electromagnetic wave and the third electromagnetic wave when a third phase of the third electromagnetic wave at the output of the third 90 deg. hybrid is substantially equal to a second phase of the second electromagnetic wave output at the third 90 deg. hybrid plus 180 deg.

In an embodiment, detecting the parity of the first magnet field and the second magnetic field based on constructive wave interference or destructive wave interference at the output of the third 90 deg. hybrid includes detecting a power of the second electromagnetic wave when there is constructive interference between the second electromagnetic wave and the third electromagnetic wave and detecting substantially zero power when there is destructive interference between the second electromagnetic wave and the third electromagnetic wave.

In an embodiment, the method further includes setting a fixed magnitude and an orientation of the first magnetic field applied by the first magnetic source to the first three-wave mixing device and varying an orientation and magnitude of the second magnetic field applied by the second magnetic source to maximize a power of the second electromagnetic wave output via the third 90 deg. hybrid and determine the orientation and magnitude of the second magnetic field when a maximum power of the second electromagnetic wave is achieved.

In an embodiment, the method further includes setting a fixed magnitude and an orientation of the first magnetic field applied by the first magnetic source to the first three-wave mixing device, upconverting a low frequency varying magnetic noise applied to the second three-wave mixing device to microwave frequencies and determining a dependence of the low frequency varying magnetic noise over time.

A further aspect of the present invention is to provide a quantum mechanical computer including a plurality of superconducting qubits disposed within a cryogenic vessel, the plurality of qubits being capacitively shunted to form a plurality of capacitively shunted flux qubits (CSFQs) wherein in operation a current circulates through the plurality of capacitively shunted qubits such that each qubit state of each qubit in the plurality of capacitively shunted qubits is encoded in a direction of the current; and a plurality of three-wave mixing Josephson devices being disposed in a vicinity of the plurality of capacitively shunted flux qubits, each of the plurality of capacitively shunted flux qubits is inductively coupled to a corresponding one of the plurality of three-wave mixing Josephson devices. In operation, the circulating current generates a magnetic flux bias through the corresponding one of the plurality of three-wave mixing Josephson devices to bias the plurality of three-wave mixing Josephson devices. A parity of the qubit states is determined based on the magnetic flux bias generated through the corresponding one of the plurality of three-wave mixing Josephson devices and based on a measured transmitted electromagnetic wave through each of the plurality of three-wave mixing Josephson devices. In an embodiment, each of the plurality of three-wave mixing Josephson devices is disposed above or below each of the plurality of capacitively shunted flux qubits.

BRIEF DESCRIPTION OF THE DRAWINGS

Concepts of the present invention, as well as methods of operation and functions of related elements of structure and combinations of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIGS. 3A and 3B show a superconducting Josephson circuit configured to detect a parity of magnetic fields, according to an embodiment of the present invention;

DETAILED DESCRIPTION

In order to measure the parity of magnetic fields or the parity of qubits more efficiently, a gyrator can be used. A gyrator is a microwave device that has an input port (port 1) and an output port (port 2). When electromagnetic waves propagate from port 1 to port 2, the electromagnetic waves get transmitted with a unity transmission and the phase of the electromagnetic waves are shifted by 180 deg. However, when the electromagnetic waves propagate from port 2 to port 1 (i.e., the opposite direction), the electromagnetic waves get transmitted with a unity transmission but the phase of the electromagnetic waves are not shifted or are shifted by 360 deg.

A pair of non-degenerate parametric devices (Josephson parametric converters (JPCs)) can be used to build a superconducting lossless gyrator. When the JPC pair operates as a gyrator, the JPC may not provide any photon gain and is essentially used as frequency converters with or without inducing a phase shift as explained above. The JPC uses a Josephson ring modulator (JRM) that is incorporated into two microwave resonators at an rf-current anti-node of their fundamental eigenmodes.

The Josephson ring modulator (JRM) is a nonlinear dispersive device based on Josephson tunnel junctions that can perform three-wave mixing of microwave signals at the quantum limit. The JRM has a plurality of nominally identical Josephson junctions (JJs) arranged in Wheatstone-like bridge configuration. The performance of the JPC including power gain, dynamical bandwidth, and dynamic range, are strongly dependent on the critical current of the Josephson junction of the JRM, the specific realization of the electromagnetic environment (i.e. the microwave resonators), and the coupling between the JRM and the resonators. Various microwave resonators have been realized and proposed including coplanar strip-line resonators, microstrip resonators, compact/lumped-element resonators, and three-dimensional cavities.

The term "Wheatstone-like configuration" is intended to refer to a circuit that has at least four Josephson junctions (JJs) connected in a similar fashion as the arrangement of resistors in a classical Wheatstone bridge circuit. However, the "Wheatstone-like configuration" of the JRM is a quantum mechanical circuit that has a plurality of JJs, not a classical electrical circuit.

Figure 1A:
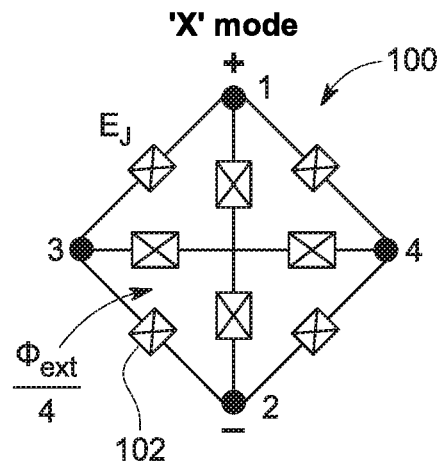
FIGS. 1A-1C show a bridge circuit having a first resonance eigenmode, a second resonance eigenmode and a third resonance eigenmode, according to an embodiment of the present invention.
Figure 1B:
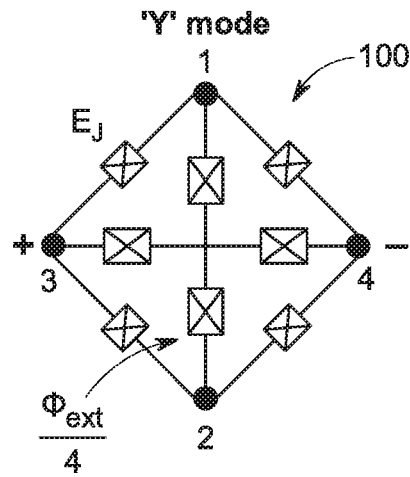
Figure 1C:
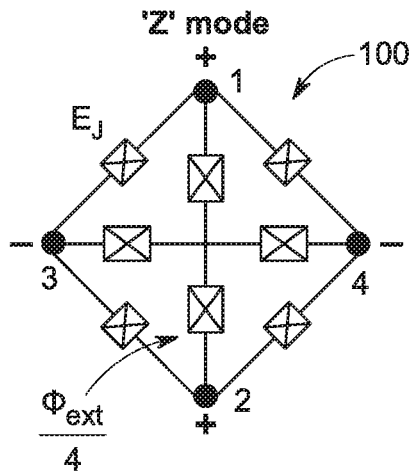

For example, FIGS. 1A-1C show a bridge circuit 100 having a first resonance eigenmode, a second resonance eigenmode and a third resonance eigenmode, according to an embodiment of the present invention. FIGS. 1A-1C show the radiofrequency (RF) voltage polarity on the bridge nodes corresponding to the first, second, and third eigenmodes. FIG. 1A shows the bridge circuit 100 operating in the first eigenmode (X-mode). FIG. 1B shows the bridge circuit operating in the second eigenmode (Y-mode). FIG. 1C shows the bridge circuit operating in the third eigenmode (Z-mode). In some embodiments, the first, second and third eigenmodes are mutually orthogonal to each other. The bridge circuit 100 which can be a Josephson Ring Modulator (JRM) in some embodiments is a nonlinear dispersive circuit based on Josephson tunnel junctions (for example in this case 8 Josephson junctions 102) that can perform three-wave mixing of electromagnetic signals (e.g., microwave signals) at the quantum limit.

The coupling constant between the three modes $g_3$ depends on energy $E_j$ of the Josephson junction, the frequencies of the modes X, Y, Z, the participation ratios of the three modes, which correspond to the ratio of the JJ inductance to the total inductance of the resonant mode structure and on the magnetic flux threading the JRM loop $\Phi_{ext}$. The sign of $g_3$ depends on the direction of the circulating direct current (DC) current in the outer loop of the JRM $I_{circ}$, or alternatively on the external magnetic flux threading the JRM loop $\Phi_{ext}$. For a zero-flux bias $\Phi_{ext}=0$, $g_3=0$. For $\Phi_{ext}>0$, $g_3<0$, whereas $\Phi_{ext}<0$, $g_3>0$.

Figure 2A:
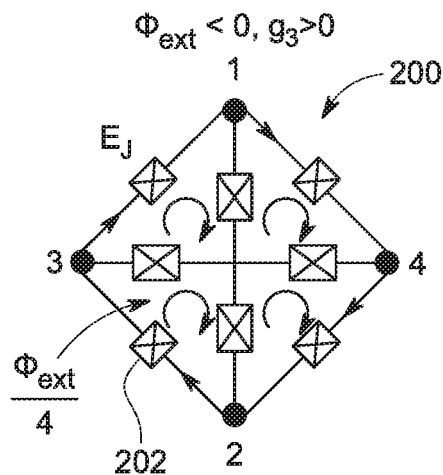
FIGS. 2A-2C show a bridge circuit having a coupling constant $g_3$ between the three resonance eigenmodes, which depends on the magnetic flux threading the loop of the bridge circuit and which is nonzero when the flux is nonzero, according to another embodiment of the present invention.
Figure 2B:
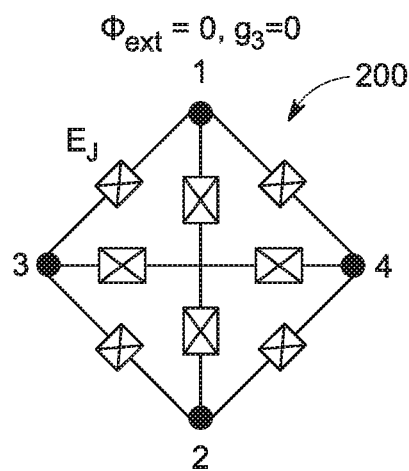
Figure 2C:
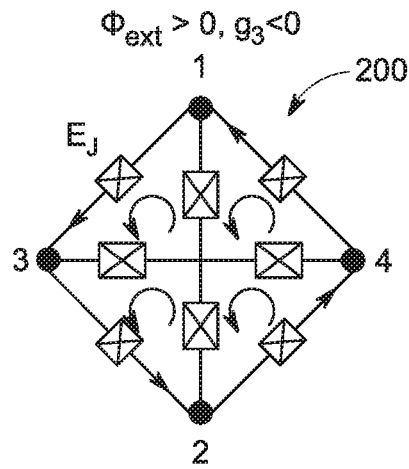

FIGS. 2A-2C show a bridge circuit 200 having a first resonance eigenmode, a second resonance eigenmode and a third resonance eigenmode, according to an embodiment of the present invention, whose coupling constant g3 is dependent on the external magnetic flux $\Phi_{ext}$ threading the JRM loop. The bridge circuit 200 which can be a Josephson Ring Modulator (JRM) in some embodiments is a nonlinear dispersive circuit based on Josephson tunnel junctions (for example in this case 8 Josephson junctions 202) that can perform three-wave mixing of electromagnetic signals (e.g., microwave signals) at the quantum limit. When a pump drive (i.e., a coherent microwave tone) is applied to the JPC (hence the JRM) the coupling constant $g_{ab}$ between modes a and b of the JPC is given by:

$$g_{ab}=g_3\sqrt{n_p}e^{-i\varphi_p},$$

where $n_p$ is the average number of pump photons circulating in the device, and $\varphi_p$ is the phase of the pump drive. From this relation, we can see that for $g_3<0$, the pump phase is shifted by $\pi$, compared to when $g_3>0$. As we show in the following paragraphs, we use this sign reversal property of the coupling constant of the JRM, which depends on the applied magnetic field direction, to detect the orientation parity of magnetic sources coupled to JRMs, using a microwave transmission measurement.

In an embodiment, a JRM loop area of A=100 μm×100 μm, for example, can detect orthogonal magnetic field variations at the JRM plane in the range $$2\cdot 10^{-8}\ T = \frac{0.1\Phi_0}{A} \leq |B_{ext}| \leq \frac{\Phi_0}{A} = 2\cdot 10^{-7}\ T.$$

However, much smaller magnetic field bounds can be detected using a larger loop. However, bigger loops may in some circumstances also add series linear inductance to the JRM, which may be undesirable (especially when it is comparable to the Josephson inductance of the JJs).

FIGS. 3A and 3B show a superconducting Josephson circuit 300 configured to detect a parity of magnetic fields, according to an embodiment of the present invention. The superconducting Josephson circuit 300 includes a first three-wave mixing Josephson device JPC1 302 and a second three-wave mixing Josephson device JPC2 304. The first three-wave mixing Josephson device JPC1 302 has an input 302A and an output 302B. The second three-wave mixing Josephson device JPC2 304 has an input 304A and an output 304B. The input 304A of the second three-wave mixing Josephson device JPC2 304 is coupled to the output 302B of the first three-wave mixing Josephson device JPC1 302. In an embodiment, the first and second three-wave mixing Josephson devices 302 and 304 are configured to operate in full conversion mode. In an embodiment, each of the first and second three-wave mixing Josephson devices 302 and 304 is configured to operate as a lossless frequency upconverter or a lossless frequency downconverter.

In an embodiment, a method of detecting parity of weak magnetic fields includes inputting a first electromagnetic pump drive 306 having a first pump phase ($\varphi 1 = \varphi_p$) to the first three-wave mixing Josephson device 302. The method further includes inputting a second electromagnetic pump drive 308 having a second pump phase ($\varphi 2 = \varphi_p + \pi/2$) to the second three-wave mixing Josephson device 304. The first pump phase ($\varphi 1 = \varphi_p$) and the second pump phase ($\varphi 2 = \varphi_p + \pi/2$) being shifted relative to each other by approximately 90 deg. ($\pi/2$).

The method further includes inputting a first electromagnetic wave 310 to the first three-wave mixing Josephson device 302 to output a second electromagnetic wave 312 after passing through the second three-wave mixing Josephson device 304. The method alternatively includes inputting the first electromagnetic wave 310 to the second three wave mixing Josephson device 304 to output a third electromagnetic wave 314 after passing through the first three-wave mixing Josephson device 302.

The method further includes detecting a parity of a first magnetic field B1 applied by a first magnetic source 316 to the first three-wave mixing device 302 and a second magnetic field B2 applied by a second magnetic source 318 to the second three-wave mixing device 304 based on a phase difference between a second phase ($\theta 2$) of the second electromagnetic wave 312 and a first phase ($\theta 1$) of the first electromagnetic wave 310 or a phase difference between a third phase ($\theta 3$) of the third electromagnetic wave 314 and the first phase ($\theta 1$) of the first electromagnetic wave 310. And, also based on a first pump phase ($\varphi 1 = \varphi_p$) of the first electromagnetic pump drive 306 and a second pump phase ($\varphi 2 = \varphi_p + \pi/2$) of the second electromagnetic pump drive 308.

In the embodiment shown in FIG. 3A, the second phase ($\theta 2$) of the second electromagnetic wave 312 is equal to the first phase ($\theta 1$) of the first electromagnetic wave 310. In addition, the third phase ($\theta 3$) of the third electromagnetic wave 314 is equal to the first phase ($\theta 1$) of the first electromagnetic wave 310 plus 180 deg. ($\pi$). In the embodiment shown in FIG. 3B, the two magnetic sources flux-biasing the JPCs have opposite directions than the case in FIG. 3A, the second phase ($\theta 2$) of the second electromagnetic wave 312 is also equal to the first phase ($\theta 1$) (modulo $2\pi$) of the first electromagnetic wave 310. In addition, the third phase ($\theta 3$) of the third electromagnetic wave 314 is also equal to the first phase ($\theta 1$) of the first electromagnetic wave 310 plus 180 deg. ($\pi$) (modulo $2\pi$).

In an embodiment, the first three-wave mixing device 302 is configured to convert the first electromagnetic wave 310 having a first frequency (f1) into an electromagnetic wave having a second frequency (f2) and transmit the electromagnetic wave having the second frequency (f2) through output 302B. The second three-wave mixing device 304 is configured to convert the electromagnetic wave having the frequency (f2) input through input 304A into an electromagnetic wave having a first frequency (f1). The frequency (f1) can be greater than the frequency (f2) or vice versa.

In an embodiment detecting a parity comprises detecting an even parity or odd parity depending on the orientation of magnetic field flux-biasing the respective JPCs. An even parity is defined herein as being two magnetic fields having substantially the same orientation, i.e., oriented generally in the same direction (for example both magnetic fields are oriented up or both magnetic fields are oriented down). An odd parity is defined herein as being two magnetic fields having generally opposite orientations, i.e., oriented generally in opposite directions (for example one magnetic field can be oriented up while the other magnetic field magnetic field is oriented down). In an embodiment, the term "oriented generally in the same direction" means that the magnetic fields have the same orientation plus or minus 10 deg. Similarly, in an embodiment, the term "oriented generally in opposite directions" means that the magnetic fields have opposite direction plus or minus 10 deg.

In an embodiment, detecting the parity comprises detecting an even parity when the second pump phase ($\varphi 2 = \varphi_p + \pi/2$) is substantially equal to the first pump phase ($\varphi 1 = \varphi_p$) plus 90 deg., the first phase ($\theta 1$) of the first electromagnetic wave 310 is substantially equal to the second phase ($\theta 2 = \theta 1$) of the second electromagnetic wave 312, and the third phase ($\theta 3 = \theta 1 + \pi$) of the third electromagnetic wave 314 is substantially equal to the first phase ($\theta 1$) plus 180 deg. ($\pi$) (modulo $2\pi$), as illustrated in FIGS. 3A and 3B, for example. In both FIGS. 3A and 3B, the parity of the magnetic fields is even. In FIG. 3A, the magnetic fields B1 and B2 are both shown oriented generally in the "up" direction". In FIG. 3B, the magnetic fields B1 and B2 are both shown oriented generally in the "down" direction. However, as it must be appreciated, the magnetic field do not need to be oriented in the "up" or "down" direction as they can be oriented in any direction as long as they keep generally the same orientation to generate generally a similar current flux in the respective loops of the JPC1 302 and JPC2 304.

Figures 5A, 5B:
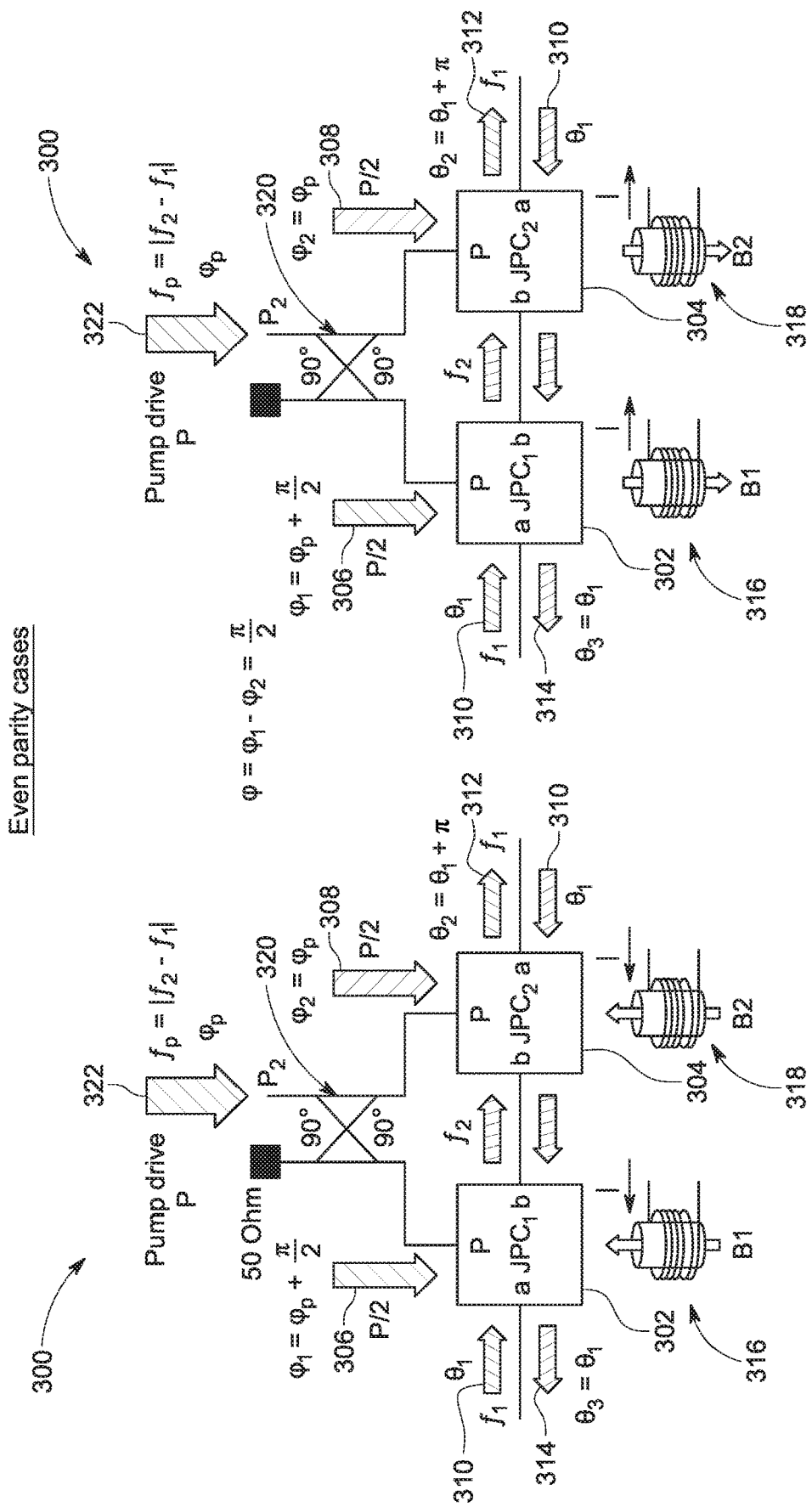
FIGS. 5A and 5B show the superconducting Josephson circuit 300 configured to detect a parity of magnetic fields in another operating configuration, according to another embodiment of the present invention.

FIGS. 5A and 5B show the superconducting Josephson circuit 300 configured to detect a parity of magnetic fields in another operating configuration, according to another embodiment of the present invention. FIGS. 5A and 5B show another configuration wherein an even parity of the magnetic fields can be detected. As shown in FIGS. 5A and 5B, in an embodiment, detecting the parity includes detecting an even parity when the first pump phase ($\varphi 1 = \varphi_p + \pi/2$) is substantially equal to the second pump phase ($\varphi 2 = \varphi_p$) plus 90 deg. ($\pi/2$), the second phase ($\theta 2 = \theta 1 + \pi$) of the second electromagnetic wave 312 is substantially equal to the first phase ($\theta 1$) of the first electromagnetic wave 310 plus 180 deg. ($\pi$), and the third phase ($\theta 3 = \theta 1$) of the third electromagnetic wave 314 is substantially equal to the first phase ($\theta 1$) (modulo $2\pi$). In both FIGS. 5A and 5B, the parity of the magnetic fields is even. In FIG. 5A, the magnetic fields B1 and B2 are both shown oriented generally in the "up" direction. In FIG. 5B, the magnetic fields B1 and B2 are both shown oriented generally in the "down" direction. However, as it must be appreciated, the magnetic field do not need to be oriented in the "up" or "down" direction as they can be oriented in any direction as long as they keep generally the same orientation to generate generally a similar current flux in the respective loops of the JPC1 302 and JPC2 304.

Figures 4A, 4B:
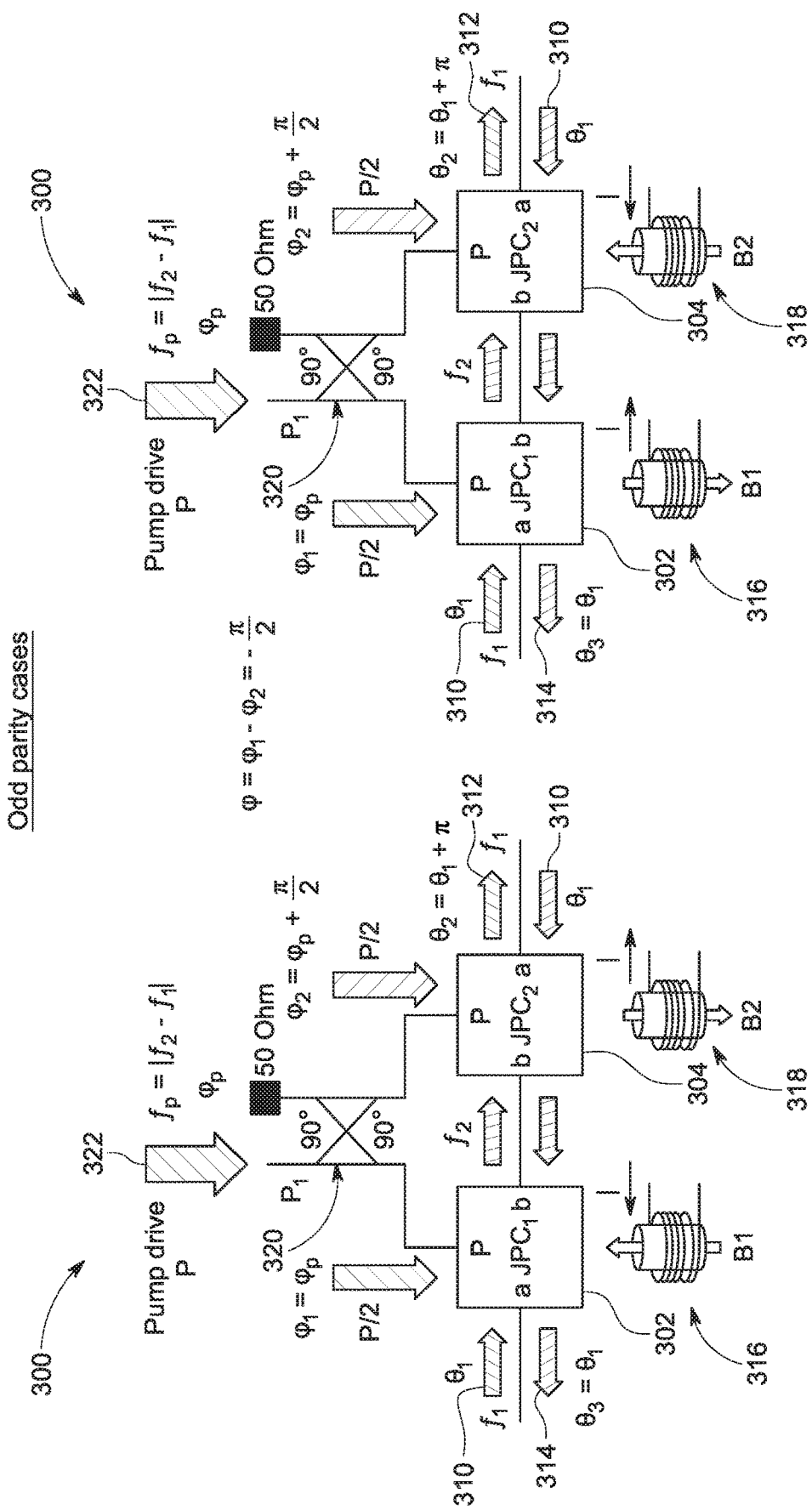
FIGS. 4A and 4B show the superconducting Josephson circuit configured to detect a parity of magnetic fields in another operating configuration, according to yet another embodiment of the present invention.

FIGS. 4A and 4B show the superconducting Josephson circuit 300 configured to detect a parity of magnetic fields in another operating configuration, according to yet another embodiment of the present invention. FIGS. 4A and 4B show another configuration wherein an odd parity of the magnetic fields can be detected. As shown in FIGS. 4A and 4B, detecting the parity includes detecting an odd parity when the second pump phase ($\varphi 2=\varphi_p+\pi/2$) is substantially equal to the first pump phase ($\varphi 1=\varphi_p$) plus 90 deg. ($\pi/2$), the second phase ($\theta 2=\theta 1+\pi$) of the second electromagnetic wave 312 is substantially equal to the first phase ($\theta 1$) of the first electromagnetic wave 310 plus 180 deg. ($\pi$) (modulo $2\pi$), and when the third phase ($\theta 3=\theta 1$) of the third electromagnetic wave 314 is substantially equal to the first phase ($\theta 1$) (modulo $2\pi$) of the first electromagnetic wave 310. In both FIGS. 4A and 4B, the parity of the magnetic fields is odd. In FIG. 4A, the magnetic fields B1 and B2 are shown oriented in opposite directions (up and down, respectively). In FIG. 4B, the magnetic fields B1 and B2 are also shown oriented in opposite directions (down and up, respectively). However, as it must be appreciated the magnetic field B1 and B2 do not need to be oriented specifically up and down as long as they are oriented generally in opposite directions and interacting with JPC1 302 and JPC2 304 to generate a current flux in the respective JPCs. As it can be appreciated, in an embodiment, we do not need to measure the phase difference of the transmitted signal in both directions to infer the parity of the magnetic sources direction. It is sufficient to measure the phase difference in one direction $\theta 2-\theta 1$ or $\theta 3-\theta 1$.

Figures 6A, 6B:
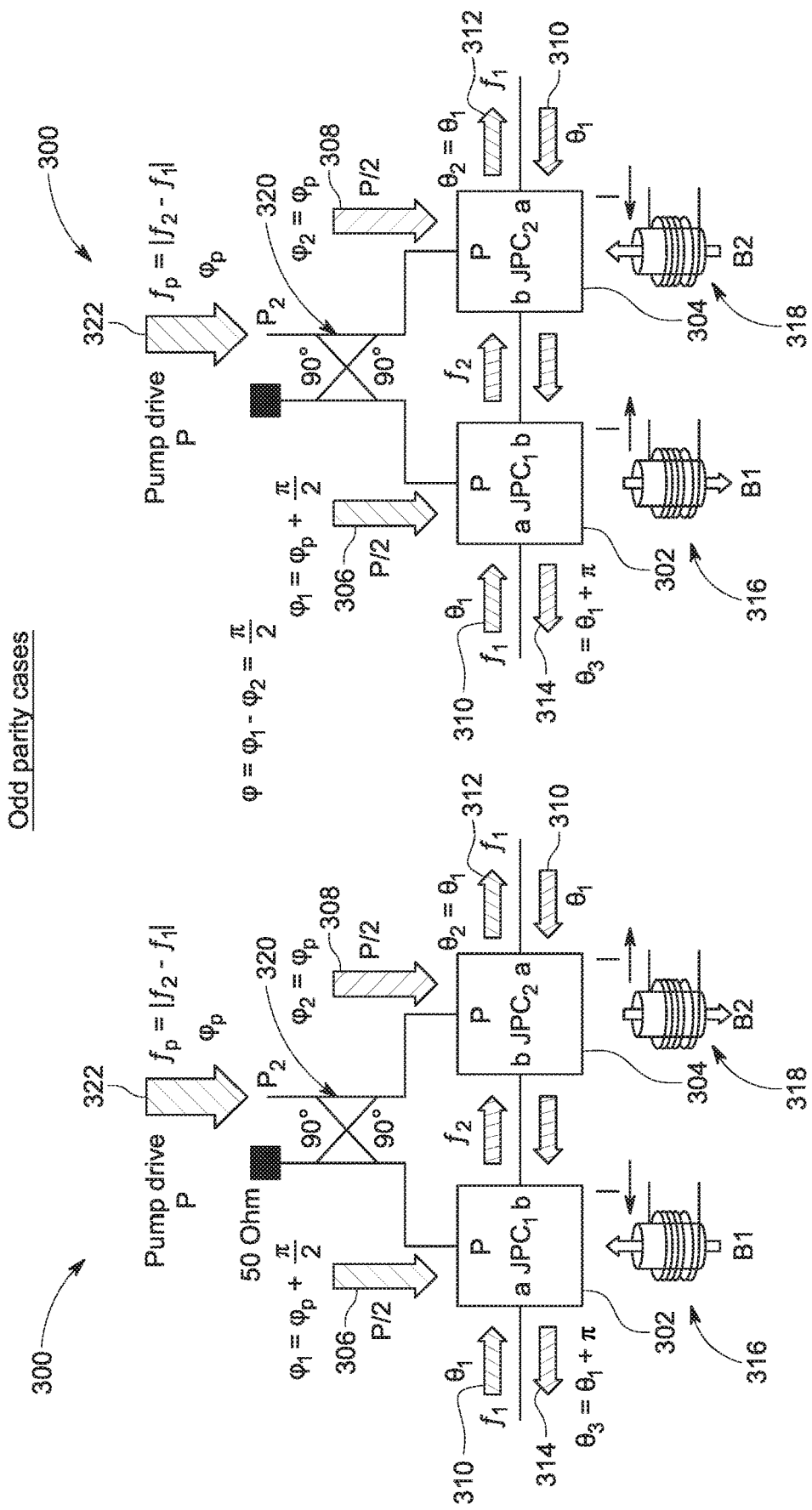
FIGS. 6A and 6B show the superconducting Josephson circuit 300 configured to detect a parity of magnetic fields in another operating configuration, according to a further embodiment of the present invention.

FIGS. 6A and 6B show the superconducting Josephson circuit 300 configured to detect a parity of magnetic fields in another operating configuration, according to a further embodiment of the present invention. FIGS. 6A and 6B show another configuration wherein an odd parity of the magnetic fields can be detected. As shown in FIGS. 6A and 6B, detecting the parity includes detecting an odd parity when the first pump phase ($\varphi 1=\varphi_p+\pi/2$) is substantially equal to the second pump phase ($\varphi 2=\varphi_p$) plus 90 deg. ($\pi/2$), the second phase ($\theta 2=\theta 1$) of the second electromagnetic wave 312 is substantially equal to the first phase ($\theta 1$) (modulo $2\pi$) of the first electromagnetic wave 310, and when the third phase ($\theta 3=\theta 1+\pi$) of the third electromagnetic wave is substantially equal to the first phase ($\theta 1$) plus 180 deg. ($\pi$) (modulo $2\pi$). In FIG. 6A, the magnetic fields B1 and B2 are shown oriented in opposite directions (up and down, respectively). In FIG. 6B, the magnetic fields B1 and B2 are also shown oriented in opposite directions (down and up, respectively). However, as it must be appreciated the magnetic fields B1 and B2 do not need to be oriented specifically up and down as long as they are oriented generally in opposite directions and interacting with JPC1 302 and JPC2 304 to generate a current flux in the respective JPCs.

In an embodiment, the superconducting Josephson circuit 300 further includes a first 90 deg. hybrid 320 connected to both the first three-wave mixing Josephson device JPC1 302 and the second three-wave mixing Josephson device JPC2 304. In an embodiment, inputting the first electromagnetic pump drive 306 having the first pump phase ($\varphi 1$) to the first three-wave mixing Josephson device 302 includes inputting the first electromagnetic pump drive 306 to the first three-wave mixing Josephson device 302 via the first 90 deg. hybrid 320. In an embodiment, inputting the second electromagnetic pump drive 308 having the second pump phase ($\varphi 2$) to the second three-wave mixing Josephson device 304 includes inputting the second electromagnetic pump drive 308 to the second three-wave mixing Josephson device 304 through the first 90 deg. hybrid 320. In an embodiment, a pump drive 322 having a power (P) is input into the first 90 deg. hybrid 320 which in turn splits the pump drive 322 into the first electromagnetic pump drive 306 and the second electromagnetic pump drive 308. In an embodiment, the power (P) of the pump drive 322 is evenly split between the first electromagnetic pump drive 306 and the second electromagnetic pump drive 308 such that the power of the first electromagnetic pump drive 306 is equal to (P/2) and the power of the second electromagnetic pump drive 308 is also equal to (P/2). However, as it must be appreciated, in other embodiments, the power of the first and second electromagnetic pump drives 306 and 308 need not be equal.

Therefore, as it can be appreciated from the above paragraphs, detecting the parity of the first magnetic field B1 and the second magnetic field B2 includes detecting an even parity when the first and the second magnetic fields B1 and B2 are oriented substantially in a same direction, and detecting an odd parity when the first and the second magnetic fields B1 and B2 are oriented substantially in opposite directions. As it can be understood from the above paragraphs, the measurement method of the parity entails measuring the acquired phase shift of the microwave signal traversing the superconducting JPC-based gyrator.

Figure 7A:
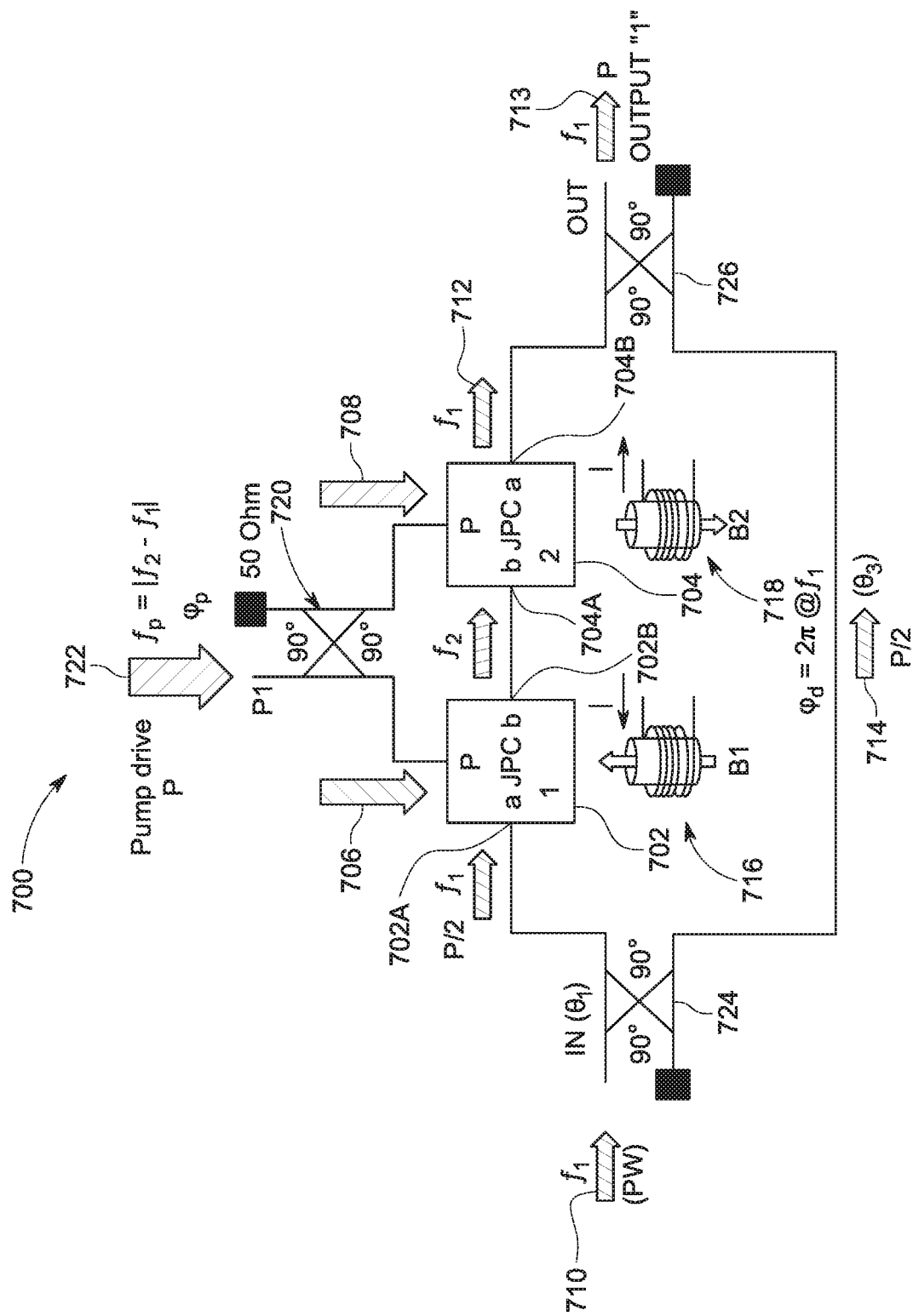
FIGS. 7A and 7B show a superconducting Josephson circuit 700 configured to detect a parity of magnetic fields, according to another embodiment of the present invention.
Figure 7B:
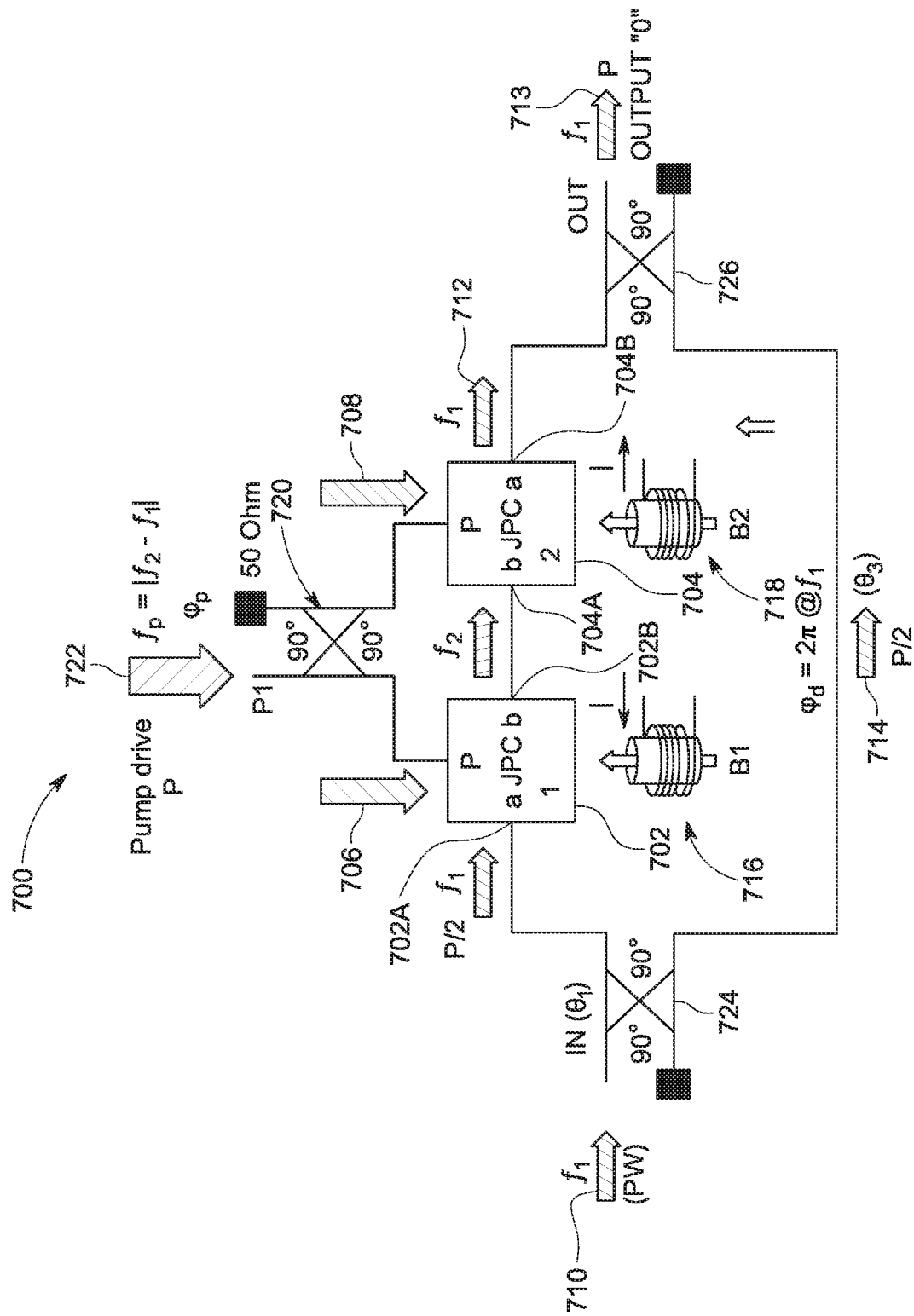

FIGS. 7A and 7B show a superconducting Josephson circuit 700 configured to detect a parity of magnetic fields, according to another embodiment of the present invention. The superconducting Josephson circuit 700 includes a first three-wave mixing Josephson device JPC1 702 and a second three-wave mixing Josephson device JPC2 704. The first three-wave mixing Josephson device JPC1 702 has an input 702A and an output 702B. The second three-wave mixing Josephson device JPC2 704 has an input 704A and an output 704B. The input 704A of the second three-wave mixing Josephson device JPC2 704 is coupled to the output 702B of the first three-wave mixing Josephson device JPC1 702. In an embodiment, the first and second three-wave mixing Josephson devices 702 and 704 are configured to operate in full conversion mode. In an embodiment, each of the first and second three-wave mixing Josephson devices 702 and 704 is configured to operate as a lossless frequency upconverter or a lossless frequency downconverter.

In an embodiment, the superconducting Josephson circuit 700 further includes a first 90 deg. hybrid 720 connected to both the first three-wave mixing Josephson device JPC1 702 and the second three-wave mixing Josephson device JPC2 704. In an embodiment, a pump drive 722 having a power (P) is input into the first 90 deg. hybrid 720 which in turn splits the pump drive 722 into the first electromagnetic pump drive 706 and a second electromagnetic pump drive 708. In an embodiment, the power (P) of the pump drive 722 is evenly split between the first electromagnetic pump drive 706 and the second electromagnetic pump drive 708 such that the power of the first electromagnetic pump drive 706 is equal to (P/2) and the power of the second electromagnetic pump drive 708 is also equal to (P/2). However, as it must be appreciated, in other embodiments, the power of the first and second electromagnetic pump drives 706 and 708 need not be equal.

In an embodiment, the superconducting Josephson circuit 700 further includes a second 90 deg. hybrid 724 connected to the first three-wave mixing Josephson device JPC1 702, and a third 90 deg. hybrid 726 connected to the second three-wave mixing Josephson device JPC2 704. The third 90 deg. hybrid 726 is further connected to the second 90 deg. hybrid 724.

In an embodiment, another method of detecting the parity of weak magnetic fields is provided herein. The method includes inputting the first electromagnetic pump drive 706 to the first three-wave mixing Josephson device 702 via the first 90 deg. hybrid 720. The method further includes inputting the second electromagnetic pump drive 708 to the second three-wave mixing Josephson device 704 via the first 90 deg. hybrid 720.

The method also includes inputting a first electromagnetic wave 710 via the second 90 deg. hybrid 724 connected to the first three-wave mixing Josephson device 702 to output a second electromagnetic wave 712 before passing through the third 90 deg. hybrid 726 connected to the second three-wave mixing Josephson device 704. The method also includes transmitting a third electromagnetic wave 714 from the second 90 deg. hybrid 724 to the third 90 deg. hybrid 726.

In an embodiment, the first three-wave mixing device 702 is configured to convert the first electromagnetic wave 710 having a first frequency (f1) into an electromagnetic wave having a second frequency (f2) and transmit the electromagnetic wave having the second frequency (f2) through output 702B. The electromagnetic wave having the second frequency (f2) is input through input 704A of the second three-wave mixing device 704. The second three-wave mixing device 704 is configured to convert the electromagnetic wave having the frequency (f2) input through input 704A into an electromagnetic wave having a first frequency (f1). The frequency (f1) can be greater than the frequency (f2) or vice versa.

The method further includes detecting a parity of a first magnetic field B1 applied by a first magnetic source 716 to the first three-wave mixing device 702 and a second magnetic field B2 applied by a second magnetic source 718 to the second three-wave mixing device 704 based on constructive wave interference or destructive wave interference of the second electromagnetic wave 712 and the third electromagnetic wave 714 at the output of the third 90 deg. hybrid 726.

In an embodiment, inputting the first electromagnetic pump drive 706 includes inputting the first electromagnetic pump drive 706 having a first pump phase ($\varphi_p$) and inputting the second electromagnetic pump drive 708 having a second pump phase ($\varphi_p+\pi/2$) shifted relative to the first pump phase ($\varphi_p$) by 90 deg. ($\pi/2$). In an embodiment, inputting the first electromagnetic wave 710 via the second 90 deg. hybrid 724 to output the second electromagnetic wave 712 through the third 90 deg. hybrid 726 includes inputting the first electromagnetic wave 710 having a first phase ($\theta1$) to output the second electromagnetic wave 712 having a second phase ($\theta2=\theta1$ or $\theta1+\pi$) that is substantially equal to the first phase ($\theta1$) or substantially equal to the first phase ($\theta1$) plus 180 deg. ($\pi$). As will be explained further in detail in the following paragraphs, the relative phase of the second and third electromagnetic waves 712 and 714 depends, inter alia, on the relative orientation of first magnetic field B1 applied by the first magnetic source 716 to the first three-wave mixing device 702 and the second magnetic field B2 applied by the second magnetic source 718 to the second three-wave mixing device 704.

In an embodiment, transmitting the third electromagnetic wave 714 via the second 90 deg. hybrid 724 to the third 90 deg. hybrid 716 includes transmitting the third electromagnetic wave 714 having a third phase ($\theta3=\theta1+\pi/2$) that is substantially equal to a first phase ($\theta1$) of the first electromagnetic wave plus 90 deg. ($\pi/2$). In an embodiment, transmitting the third electromagnetic wave 714 via the second 90 deg. hybrid 724 to the third 90 deg. hybrid 726 further includes adding a 90 deg. ($\pi/2$) phase shift to the third phase ($\theta3$) of the third electromagnetic wave 714 to obtain a third electromagnetic wave 714 having a third phase ($\theta3=\theta1+\pi$) that is substantially equal to the first phase ($\theta1$) plus 180 deg. ($\pi$).

In an embodiment, detecting the parity of the first magnet field B1 and the second magnetic field B2 based on constructive wave interference or destructive wave interference at the output of the third 90 deg. hybrid 726 includes detecting a constructive interference of the second electromagnetic wave 712 and the third electromagnetic wave 714 when a third phase ($\theta3$) of the third electromagnetic wave 714 at the third 90 deg. hybrid 726 substantially matches the second phase ($\theta2$) of the second electromagnetic wave at the third 90 deg. hybrid 726.

In the embodiment, as shown in FIG. 7A, the magnetic fields B1 and B2 are oriented substantially in opposite directions (e.g., up and down, respectively). In this embodiment, the second phase ($\theta2=\theta1+\pi$) of the second electromagnetic wave 712 is equal to the first phase ($\theta1$) of the first electromagnetic wave 310 plus 180 deg. ($\pi$). The second electromagnetic wave 712 is transmitted through the horizontal arm of the third 90 deg. hybrid 726 and thus is not affected by the third 90 deg. hybrid 726. In addition, the third phase of the third electromagnetic wave 714 after passing through the second 90 deg. hybrid 724 is ($\theta3=\theta1+\pi/2$). The third electromagnetic wave 714 is then transmitted through a diagonal arm of the third 90 deg, hybrid 726. As a result, 90 deg. phase is added to the phase of the third electromagnetic wave 714 ($\theta3+\pi/2$). Hence, the phase of the third electromagnetic wave 714 after passing through the third 90 deg. hybrid is ($\theta1+\pi$). In this situation, because the second electromagnetic wave 712 and the third electromagnetic wave 714 after passing through the third 90 deg. hybrid 726 have the same phase, i.e., a phase that is equal to the first phase plus 180 deg. (i.e., $\theta3=\theta2=\theta1+\pi$), a constructive interference is established and a full power (PW) is output through the third 90 deg. hybrid 726 at output 713. The full power (PW) is encoded as state "1." Therefore, constructive interference provides an output of "1."

In the embodiment shown in FIG. 7B, the magnetic fields B1 and B2 are oriented substantially in a same direction (e.g., both up). In this embodiment, the second phase ($\theta2=\theta1$) of the second electromagnetic wave 712 is equal to the first phase ($\theta1$) of the first electromagnetic wave 710. In addition, the third phase ($\theta3$) of the third electromagnetic wave 714 after passing through the second 90 deg. hybrid 724 is ($\theta3=\theta1+\pi/2$). The third electromagnetic wave 714 is then transmitted through a diagonal arm of the third 90 deg, hybrid 726. As a result, another 90 deg. phase is added to the phase of the third electromagnetic wave 714 ($\theta3+\pi/2$). Hence, the phase of the third electromagnetic wave 714 is ($\theta1+\pi$). In this situation, because the second electromagnetic wave 712 and the third electromagnetic wave 714 after passing through the third 90 deg. hybrid 726 have phases that are shifted relative to each other by it (i.e., $\theta2=\theta1$ while $\theta3=\theta1+\pi$), a destructive interference is established and substantially zero power is output through the third 90 deg. hybrid 716 at output 713. The zero power is encoded as state "0." Therefore, destructive interference provides an output of "0."

Therefore, in an embodiment, detecting the parity of the first magnet field B1 and the second magnetic field B2 based on constructive wave interference or destructive wave interference at the output of the third 90 deg. hybrid 726 includes detecting a power (P) of the second electromagnetic wave 712 when there is constructive interference between the second electromagnetic wave 712 and the third electromagnetic wave 714 and detecting substantially zero power when there is destructive interference between the second electromagnetic wave 712 and the third electromagnetic wave 714.

Therefore, in an embodiment, detecting the parity of the first magnet field B1 and the second magnetic field B2 based on constructive wave interference or destructive wave interference at the output of the third 90 deg. hybrid 726 includes detecting a destructive interference of the second electromagnetic wave 712 and the third electromagnetic wave 714 when the third phase (θ3=θ2+π) of the third electromagnetic wave 714 at the output of the third 90 deg. hybrid 726 is substantially equal to the second phase (θ2) of the second electromagnetic wave 712 output through the third 90 deg. hybrid plus 180 deg. (π).

In FIG. 7A, the magnetic fields B1 and B2 are shown oriented in opposite directions (up and down, respectively). However, as it must be appreciated the magnetic fields B1 and B2 do not need to be oriented specifically up and down as long as they are oriented generally in opposite directions and interacting with JPC1 702 and JPC2 704 to generate a current flux in the respective JPCs. Similarly, in FIG. 7A, the magnetic fields B1 and B2 are both shown oriented generally in the "up" direction. However, as it must be appreciated, the magnetic fields do not need to be oriented in the "up" as they can be oriented in any direction as long as they keep generally the same orientation to generate a current flux in the respective loops of the JPC1 702 and JPC2 704.

In an embodiment, there is provided a method to determine an orientation of the first magnetic field B1 flux biasing the first three-wave mixing Josephson device JPC1 702 given that the orientation of the second magnetic field B2 exciting the second three-wave mixing Josephson device JPC2 704 is known. The above described method further includes setting a fixed magnitude and an orientation of the first magnetic field B1 applied by the first magnetic source 716 to the first three-wave mixing device 702 and varying an orientation and magnitude of the second magnetic field B2 applied by the second magnetic source 718 to maximize a power of the second electromagnetic wave 712 output via the third 90 deg. hybrid 726 and determine the orientation and magnitude of the second magnetic field B2 when a maximum power of the output electromagnetic wave 713 is achieved.

In another embodiment, the method further includes setting a fixed magnitude and an orientation of the first magnetic field B1 applied by the first magnetic source 716 to the first three-wave mixing device 702, upconverting a low-frequency varying magnetic noise B2 applied to the second three-wave mixing device 704 to microwave frequencies and determining a dependence of the low-frequency varying magnetic noise B2 over time.

Figure 8:
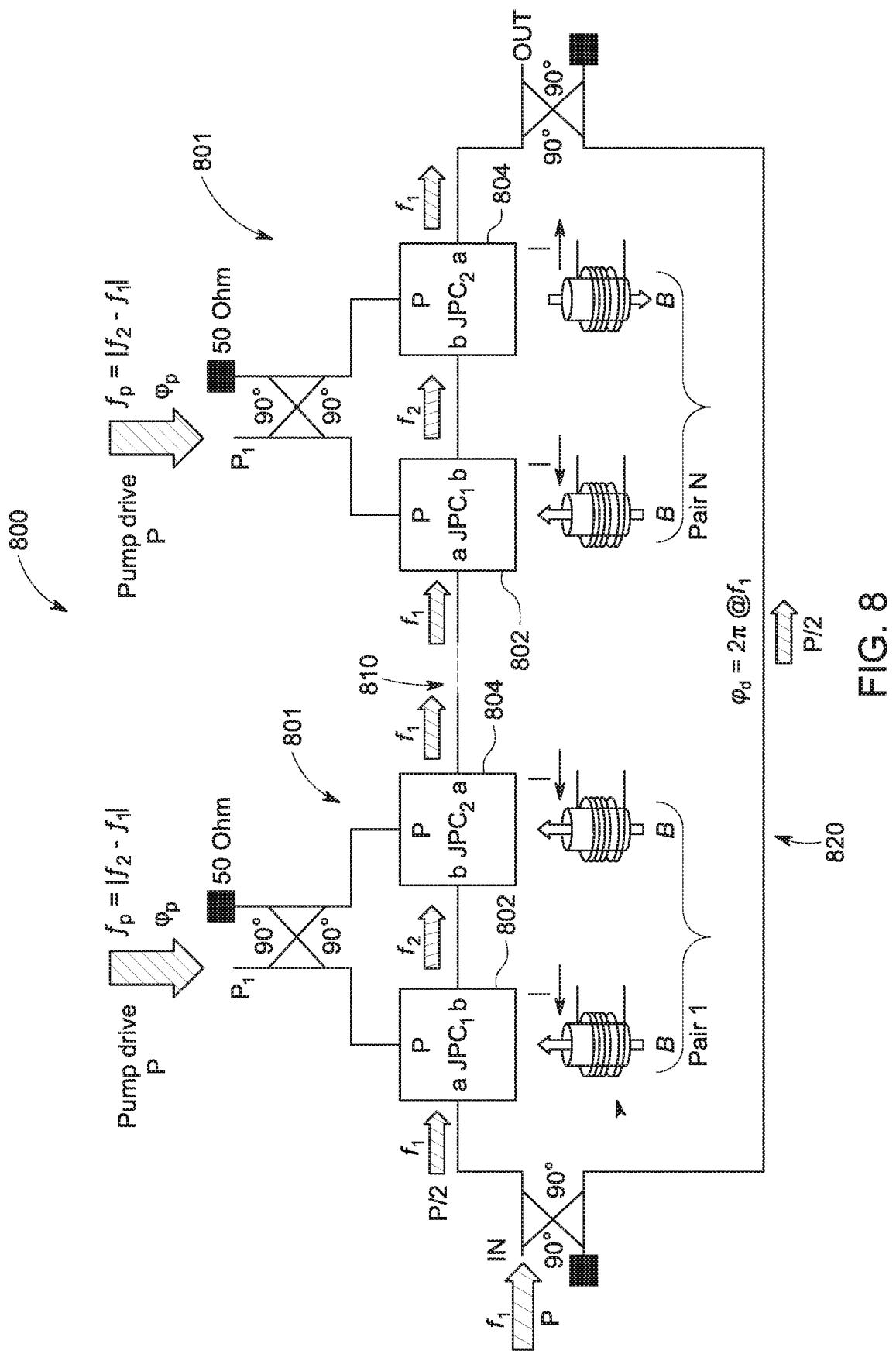
FIG. 8 is an interferometric device 800 having a plurality of superconducting Josephson circuits for detecting parity of a chain of weak magnetic sources, according to an embodiment of the present invention.

FIG. 8 is an interferometric device 800 having a plurality of superconducting Josephson circuits 801 for detecting parity of weak magnetic sources, according to an embodiment of the present invention. Each of the plurality of the superconducting Josephson circuits 801 has a first three-wave mixing Josephson device JPC1 802 and a second three-wave mixing Josephson device JPC2 804 similar to the superconducting Josephson circuits 300, 700 described in the above paragraphs. The plurality of the superconducting Josephson circuits 801 are connected in series such that an output from one superconducting Josephson circuit 801 is connected to an input of another superconducting Josephson circuit 801. Each of the first three-wave mixing Josephson device JPC1 802 and the second three-wave mixing Josephson device JPC2 804 in each of the plurality of superconducting Josephson circuits has a corresponding magnetic source B that creates a flux current through the loop of the respective JPCs. Therefore, for N pairs of magnetic sources we have 2N individual magnetic sources, a pair of magnetic sources being provided for each of the plurality N of superconducting Josephson circuits 801. For example, if k of these magnetic sources point upwards (where k is an integer 12N), then k'=2N−k point downwards.

In a first case, if k is an even number then k'=2N−k is even number as well, which means that the parity of the sources is even. In a second case, if k is an odd number then k'=2N−k is odd number as well, which means that the parity of the sources is odd.

It is noted that each pair that consists of sources from a same group, subgroup K or subgroup K', adds a zero-phase shift (modulo 2π) to the total phase along the upper arm 810 of the interferometric device 800. Each pair that consists of sources from different groups, subgroup K and subgroup K', adds a 180 deg. (π) (modulo 2π) phase shift to the total phase along the upper arm 810 of the interferometric device 800.

In the first case, there must be an even number of pairs that are mixed from K and K'. Because if the number of mixed pairs is odd, then there is an odd number left in each group to pair together in the same subgroup (which won't work). This means that the total acquired phase along the upper arm modulo 2π is 0. In this case, there is no output signal (i.e., an output signal power that is zero or substantially small) as explained in the above paragraphs with respect to FIGS. 7A and 7B.

In the second case, there must be an odd number of pairs that are mixed from K and K'. Because if the number of mixed pairs is even, then there is an odd number left in each group to pair together in the same subgroup (which won't work). This means that the total acquired phase along the upper arm modulo 2π is π. In this case, there is an output signal (i.e., an output signal power that is nonzero and relatively large) as explained in the above paragraphs with respect to FIGS. 7A and 7B.

Figure 9:
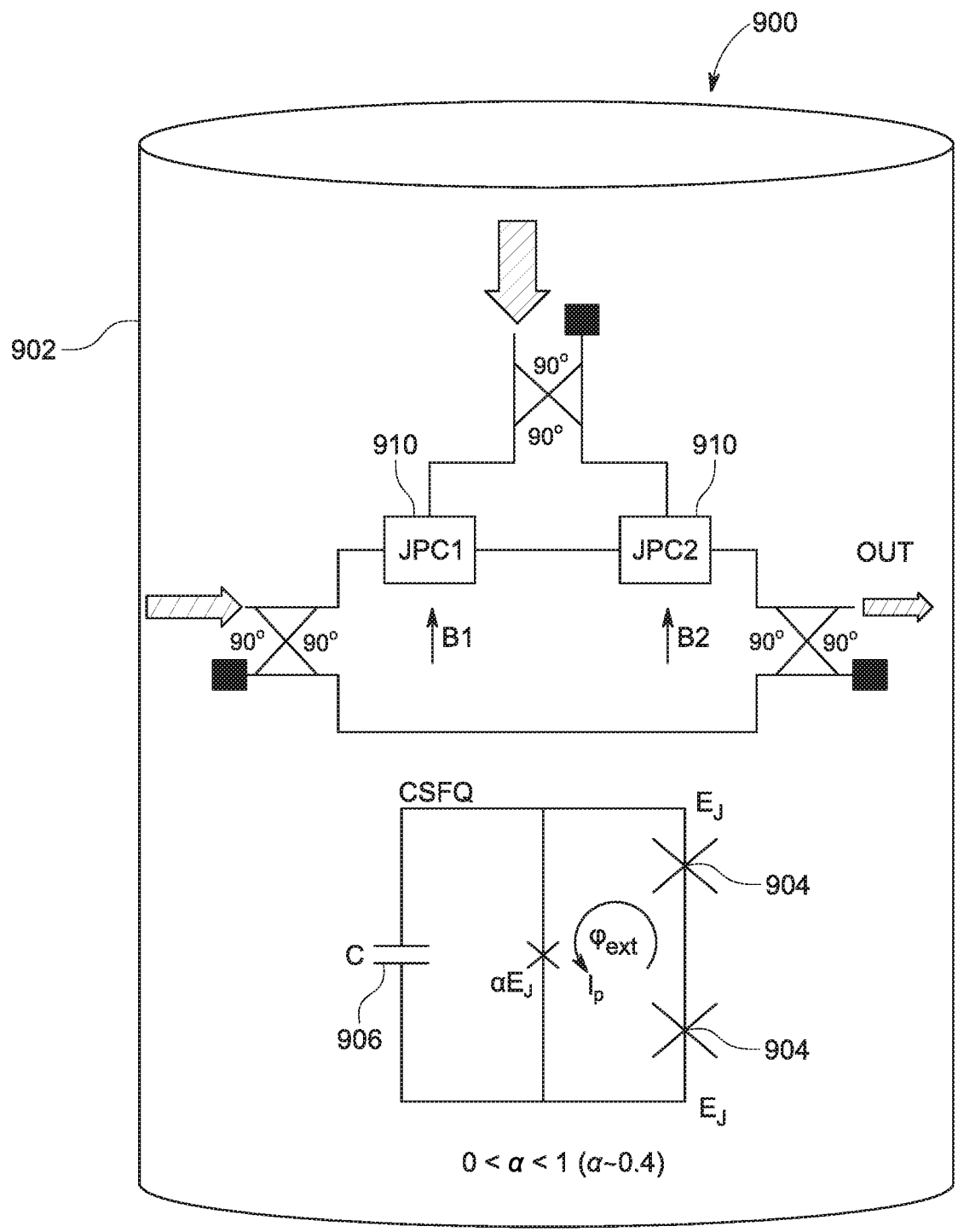
FIG. 9 shows a schematic diagram of a quantum mechanical computer, according to an embodiment of the present invention.

Another aspect of the present invention is to provide a quantum mechanical computer. FIG. 9 shows a schematic diagram of a quantum mechanical computer 900, according to an embodiment of the present invention. The quantum computer 900 includes a plurality of superconducting qubits 904 disposed within a cryogenic vessel 902. The plurality of qubits 904 are capacitively shunted (using capacitance 906) to form a plurality of capacitively shunted flux qubits (CSFQs) 904. In operation a current Ip circulates through the plurality of capacitively shunted qubits 904 such that each qubit state of each qubit in the plurality of capacitively shunted qubits 904 is encoded in a direction of the current Ip.

The quantum computer 900 further includes a plurality of three-wave mixing Josephson devices (JPCs) 910 that are disposed in a vicinity of the plurality of capacitively shunted flux qubits 904. Each of the plurality of capacitively shunted flux qubits 904 is inductively coupled to a corresponding one of the plurality of three-wave mixing Josephson devices 910.

In operation, the circulating current Ip generates a magnetic flux bias (B1, B2) through the corresponding one of the plurality of three-wave mixing Josephson devices 910 to bias the plurality of three-wave mixing Josephson devices 910. A parity of the qubit states of the plurality of qubits 904 can be determined based on the magnetic flux bias (B1, B2) generated through the corresponding one of the plurality of three-wave mixing Josephson devices 910 and based on a measured transmitted electromagnetic wave through each of the plurality of three-wave mixing Josephson devices 910.

In an embodiment, each of the plurality of three-wave mixing Josephson devices 910 can be disposed above or below each of the plurality of capacitively shunted flux qubits 904. For example, the plurality of capacitively shunted flux qubits 904 can be provided on a qubit layer structure and the plurality of three-wave mixing Josephson devices 910 can be provided on another layer structure above or below the qubit layer structure. Each of the plurality of three-wave mixing Josephson devices 910 can be, for example, disposed directly above or in the vicinity of corresponding each of the plurality of capacitively shunted flux qubits 904 so as to sense or detect a parity of the magnetic fields and thus sense of detect a parity of the qubit states of the corresponding plurality of qubits 904. A size or area of each of the plurality of three-wave mixing Josephson devices can be selected so as to achieve the desired sensitivity to detect the parity of the qubit states of the plurality of qubits 904.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A method of detecting parity of weak magnetic fields comprising:
    inputting a first electromagnetic pump drive having a first pump phase to a first three-wave mixing Josephson device;
    inputting a second electromagnetic pump drive having a second pump phase to a second three-wave mixing Josephson device, the first pump phase and the second pump phase being shifted relative to each other by approximately 90 deg. (pi/2), and an input of the second three-wave mixing Josephson device being coupled to an output of the first three-wave mixing Josephson device;
    inputting a first electromagnetic wave to the first three-wave mixing Josephson device to output a second electromagnetic wave after passing through the second three-wave mixing Josephson device, or inputting the first electromagnetic wave to the second three wave mixing Josephson device to output a third electromagnetic wave after passing through the first three-wave mixing Josephson device; and
    detecting a parity of an orientation of a first magnetic field applied by a first magnetic source to the first three-wave mixing device and a second magnetic field applied by a second magnetic source to the second three-wave mixing device based on a first phase of the first electromagnetic wave, a second phase of the second electromagnetic wave, a third phase of the third electromagnetic wave, a first pump phase of the first electromagnetic pump drive and a second pump phase of the second electromagnetic pump drive.

2. The method according to claim 1, wherein detecting the parity comprises detecting an even parity when the second pump phase is substantially equal to the first pump phase plus 90 deg., the first phase of the first electromagnetic wave is substantially equal to the second phase of the second electromagnetic wave modulo 360 deg., and the third phase of the third electromagnetic wave is substantially equal to the first phase plus 180 deg. modulo 360 deg.

3. The method according to claim 1, wherein detecting the parity comprises detecting an even parity when the first pump phase is substantially equal to the second pump phase plus 90 deg., the second phase of the second electromagnetic wave is substantially equal to the first phase of the first electromagnetic wave plus 180 deg. modulo 360 deg., and the third phase of the third electromagnetic wave is substantially equal to the first phase modulo 360 deg.

4. The method according to claim 1, wherein detecting the parity comprises detecting an odd parity when the second pump phase is substantially equal to the first pump phase plus 90 deg., the second phase of the second electromagnetic wave is substantially equal to the first phase of the first electromagnetic wave plus 180 deg. modulo 360 deg., and when the third phase of the third electromagnetic wave is substantially equal to the first phase modulo 360 deg.

5. The method according to claim 1, wherein detecting the parity comprises detecting an odd parity when the first pump phase is substantially equal to the second pump phase plus 90 deg., the second phase of the second electromagnetic wave is substantially equal to the first phase modulo 360 deg. of the first electromagnetic wave, and when the third phase of the third electromagnetic wave is substantially equal to the first phase plus 180 deg. modulo 360 deg.

6. The method according to claim 1, wherein inputting the first electromagnetic pump drive having the first pump phase to the first three-wave mixing Josephson device comprises inputting the first electromagnetic pump drive to a first three-wave mixing Josephson device via a first 90 deg. hybrid.

7. The method according to claim 6, wherein inputting the second electromagnetic pump drive having the second pump phase to the second three-wave mixing Josephson device comprises inputting the second electromagnetic pump drive to the second three-wave mixing Josephson device through the first 90 deg. hybrid.

8. The method according to claim 1, wherein detecting the parity of the first magnet field and the second magnetic field comprises detecting an even parity when the first and the second magnetic fields are oriented substantially in a same direction.

9. The method according to claim 1, wherein detecting the parity of the first magnet field and the second magnetic field comprises detecting an odd parity when the first and the second magnetic fields are oriented substantially in opposite directions.

10. A method of detecting parity of weak magnetic fields comprising:
    inputting a first electromagnetic pump drive to a first three-wave mixing Josephson device via a first 90 deg. hybrid;
    inputting a second electromagnetic pump drive to a second three-wave mixing Josephson device through the first 90 deg. hybrid, an input of the second three-wave mixing Josephson device being coupled to an output of the first three-wave mixing Josephson device;
    inputting a first electromagnetic wave via a second 90 deg. hybrid connected to the first three-wave mixing Josephson device to output a second electromagnetic wave through the second three-wave mixing Josephson device;
    transmitting a third electromagnetic wave via the second 90 deg. hybrid to a third 90 deg. hybrid connected to the second three-wave mixing Josephson device;

detecting a parity of a first magnet field applied by a first magnetic source to the first three-wave mixing device and a second magnetic field applied by a second magnetic source to the second three-wave mixing device based on constructive wave interference or destructive wave interference of the second electromagnetic wave and the third electromagnetic wave after passing through the third 90 deg. hybrid at the output of the third 90 deg. hybrid.

11. The method according to claim 10, wherein inputting the first electromagnetic pump drive comprises inputting the first electromagnetic pump drive having a first pump phase and inputting a second electromagnetic pump drive having a second pump phase shifted relative to the first pump phase by 90 deg. (pi/2).

12. The method according to claim 10, wherein inputting the first electromagnetic wave via the second 90 deg. hybrid to output the second electromagnetic wave comprises inputting the first electromagnetic wave having a first phase to output the second electromagnetic wave having a second phase that is substantially equal to the first phase or substantially equal to the first phase plus 180 deg. (pi).

13. The method according to claim 10, wherein transmitting the third electromagnetic wave via the second 90 deg. hybrid to the third 90 deg. hybrid comprises transmitting the third electromagnetic wave having a third phase that is substantially equal to a first phase of the first electromagnetic wave plus 90 deg.

14. The method according to claim 13, wherein transmitting the third electromagnetic wave via the second 90 deg. hybrid to the third 90 deg. hybrid further comprises adding a 90 deg. phase shift to the third phase of the third electromagnetic wave to obtain a third electromagnetic wave having a third phase that is substantially equal to the first phase plus 180 deg.

15. The method according to claim 10, wherein detecting the parity of the first magnet field and the second magnetic field based on constructive wave interference or destructive wave interference at the output of the third 90 deg. hybrid comprises detecting a constructive interference of the second electromagnetic wave and the third electromagnetic wave when a third phase of the third electromagnetic wave at the output of the third 90 deg. hybrid substantially matches a second phase of the second electromagnetic wave output at the third 90 deg. hybrid.

16. The method according to claim 10, wherein detecting the parity of the first magnet field and the second magnetic field based on constructive wave interference or destructive wave interference at the output of the third 90 deg. hybrid comprises detecting a destructive interference of the second electromagnetic wave and the third electromagnetic wave when a third phase of the third electromagnetic wave at the output of the third 90 deg. hybrid is substantially equal to a second phase of the second electromagnetic wave output at the third 90 deg. hybrid plus 180 deg.

17. The method according to claim 10, wherein detecting the parity of the first magnet field and the second magnetic field based on constructive wave interference or destructive wave interference at the output of the third 90 deg. hybrid comprises detecting a power at the output of the third 90 deg. hybrid when there is constructive interference between the second electromagnetic wave and the third electromagnetic wave and detecting substantially zero power when there is destructive interference between the second electromagnetic wave and the third electromagnetic wave.

18. The method according to claim 10, further comprising setting a fixed magnitude and an orientation of the first magnetic field applied by the first magnetic source to the first three-wave mixing device and varying an orientation and magnitude of the second magnetic field applied by the second magnetic source to maximize a power of the second electromagnetic wave output via the third 90 deg. hybrid and determine the orientation and magnitude of the second magnetic field when a maximum power of the second electromagnetic wave is achieved.

19. The method according to claim 10, further comprising setting a fixed magnitude and an orientation of the first magnetic field applied by the first magnetic source to the first three-wave mixing device, upconverting a low frequency varying magnetic noise applied to the second three-wave mixing device to microwave frequencies and determining properties of the low frequency varying magnetic noise over time.

20. A quantum mechanical computer comprising:
a plurality of superconducting qubits disposed within a cryogenic vessel, the plurality of qubits being capacitively shunted to form a plurality of capacitively shunted flux qubits (CSFQs) wherein in operation a current circulates through the plurality of capacitively shunted qubits such that each qubit state of each qubit in the plurality of capacitively shunted qubits is encoded in a direction of the current;
a plurality of three-wave mixing Josephson devices being disposed in a vicinity of the plurality of capacitively shunted flux qubits, each of the plurality of capacitively shunted flux qubits is inductively coupled to a corresponding one of the plurality of three-wave mixing Josephson devices,
wherein in operation the circulating current generates a magnetic flux bias through the corresponding one of the plurality of three-wave mixing Josephson devices to bias the plurality of three-wave mixing Josephson devices,
wherein a parity of the qubit states is determined based on the magnetic flux bias generated through the corresponding one of the plurality of three-wave mixing Josephson devices and based on a measured transmitted electromagnetic wave through each of the plurality of three-wave mixing Josephson devices.

* * * * *